(12) United States Patent
Kuo et al.

(10) Patent No.: US 7,902,046 B2
(45) Date of Patent: Mar. 8, 2011

(54) THIN BUFFER LAYERS FOR SIGE GROWTH ON MISMATCHED SUBSTRATES

(75) Inventors: Yu-Hsuan Kuo, National Taiwan (TW); James S. Harris, Jr., Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 888 days.

(21) Appl. No.: 11/524,499

(22) Filed: Sep. 19, 2006

(65) Prior Publication Data

US 2007/0077734 A1 Apr. 5, 2007

Related U.S. Application Data

(60) Provisional application No. 60/718,435, filed on Sep. 19, 2005.

(51) Int. Cl.
*H01L 21/20* (2006.01)
*H01L 21/36* (2006.01)

(52) U.S. Cl. .......... 438/478; 438/300; 438/312

(58) Field of Classification Search ........... 257/19, 257/191, 347, 369, 55, 65, 66, 96; 438/10, 438/285, 37, 458, 423, 455, 518, 778, 478
See application file for complete search history.

(56) References Cited

U.S. PATENT DOCUMENTS

| | | | |
|---|---|---|---|
| 5,107,317 A | 4/1992 | Takasaki | |
| 5,294,808 A * | 3/1994 | Lo | 257/17 |
| 5,659,187 A | 8/1997 | Legoues et al. | |
| 5,886,361 A | 3/1999 | Presting et al. | |
| 6,184,144 B1 | 2/2001 | Lo | |
| 6,326,650 B1 * | 12/2001 | Allam | 257/186 |
| 6,329,063 B2 | 12/2001 | Lo et al. | |
| 6,544,900 B2 * | 4/2003 | Raaijmakers et al. | 438/769 |
| 6,724,008 B2 | 4/2004 | Fitzergald | |
| 6,784,466 B2 | 8/2004 | Chu et al. | |
| 6,864,115 B2 * | 3/2005 | Fitzgerald | 438/37 |
| 6,940,089 B2 * | 9/2005 | Cheng et al. | 257/19 |
| 6,987,310 B2 | 1/2006 | Lee et al. | |
| 7,060,632 B2 | 6/2006 | Fitzgerald et al. | |
| 7,279,698 B2 * | 10/2007 | Gardner | 257/14 |
| 2002/0100942 A1 * | 8/2002 | Fitzgerald et al. | 257/369 |
| 2002/0125475 A1 * | 9/2002 | Chu et al. | 257/55 |
| 2004/0161947 A1 * | 8/2004 | Fitzergald | 438/778 |
| 2005/0092235 A1 * | 5/2005 | Brabant et al. | 117/105 |
| 2005/0141801 A1 | 6/2005 | Gardner | |
| 2005/0156246 A1 * | 7/2005 | Lochtefeld et al. | 257/347 |
| 2005/0239255 A1 * | 10/2005 | Capewell et al. | 438/285 |

OTHER PUBLICATIONS

Richard A. Soref, "Silicon-based group IV heterstructures for optoelectronic applications," J. Vac Sci. Techno. A 14(3), May/Jun. 1996, pp. 913-918.

* cited by examiner

*Primary Examiner* — Thanh V Pham
*Assistant Examiner* — Errol Fernandes
(74) *Attorney, Agent, or Firm* — Lumen Patent Firm

(57) ABSTRACT

Growth of SiGe on a significantly lattice mismatched substrate (e.g., Si) is provided by depositing a SiGe buffer layer at a growth temperature, then annealing the resulting structure at a temperature higher than the growth temperature. Additional buffer layers can be included following the same steps. The SiGe buffer is significantly lattice mismatched with respect to the substrate, and is preferably substantially lattice matched with a SiGe device to be grown on top of the buffer. The resulting buffer structure is relatively thin and provides low defect density, and low surface roughness. Disadvantages of thick graded buffer layers, such as high cost, high surface roughness, mechanical fragility, and CTE mismatch, are thereby avoided.

23 Claims, 4 Drawing Sheets

THIN BUFFER LAYERS FOR SIGE GROWTH ON MISMATCHED SUBSTRATES

CROSS REFERENCE TO RELATED APPLICATIONS

This application claims the benefit of U.S. provisional application No. 60/718,435, filed on Sep. 19, 2005, entitled "Growth Method of Ge and Ge-rich SiGe Quantum Wells on Si", and hereby incorporated by reference in its entirety. This application also claims the benefit of U.S. patent application Ser. No. 11/230,285, filed Sep. 19, 2005 and entitled "Ge—Si Quantum Well Structures". U.S. application Ser. No. 11/230,285 claims the benefit of U.S. provisional application No. 60/635,093, filed on Dec. 9, 2004.

FIELD OF THE INVENTION

This invention relates to growth of SiGe on lattice mismatched substrates.

BACKGROUND

Lattice mismatch is a key parameter for semiconductor growth techniques. Typically, growth of high quality epitaxial material on a lattice matched substrate is significantly easier than growth of comparable quality material on a lattice mismatched substrate. In particular, growth on a lattice mismatched substrate tends to lead to the formation of threading dislocations (and other defects, such as rough surfaces) which extend upward from the substrate and pass through active regions of semiconductor devices, thereby degrading device performance and/or reliability.

Improving the quality of lattice mismatched growth by reducing defect density has been extensively investigated in the art. Various techniques have been described. For example, U.S. Pat. No. 6,184,144 considers various growth methods which are intended to provide inherently dislocation-free growth. More commonly, lattice mismatched growth is accomplished by growing a buffer structure on the substrate, then growing a device structure on top of the buffer structure. The top surface of the buffer structure is lattice matched to the device structure, so growth of the device structure on the buffer is not lattice mismatched, even though the device structure is lattice mismatched relative to the substrate.

Several different buffer structures and buffer growth methods have been described in the art, as applied to various material systems. For example, U.S. Pat. No. 5,107,317 considers growth of GaAs or a GaAs containing alloy on a Si substrate with a two-layer buffer structure. The first buffer layer is GaAs or a GaAs containing alloy, and the second buffer layer is Ge or a Ge containing alloy. U.S. Pat. No. 6,987,310 considers growth of SiGe on Si where a three-layer buffer structure is grown, then annealed (e.g., 1 hour at 950° C.). U.S. Pat. No. 5,659,187 considers a compositionally graded buffer. U.S. Pat. No. 6,724,008 considers a compositionally graded buffer for growth of SiGe on Si, where the buffer is planarized prior to device growth to alleviate the surface non-uniformity typical of thick graded SiGe buffers.

In the preceding examples of compositional grading, the grading is continuous. Compositional grading can also be performed in discrete increments. For example, U.S. Pat. No. 6,864,115 considers a buffer structure for growth of SiGe on Si having multiple SiGe layers, each layer having a uniform composition. Grading is implemented by gradually increasing the Ge concentration in successive buffer layers deposited on a Si substrate. Growth is carried out at relatively low temperatures, and a higher temperature anneal is employed after growth of each buffer layer (or each few buffer layers) to reduce defect density.

Although compositional grading (discrete or continuous) has the advantages of typically providing the lowest available defect densities, and being generally applicable to a wide variety of material systems, it also has significant disadvantages. In particular, compositionally graded buffers tend to be thick, which increases growth cost, and can have other undesirable practical consequences (e.g., increased surface non-uniformity, mechanical fragility, CTE mismatch). This has motivated the development of non-graded buffer approaches (e.g., U.S. Pat. No. 5,107,317 and U.S. Pat. No. 6,987,310 above). Although non-graded buffer approaches advantageously reduce buffer thickness, these approaches tend not to have the general applicability of graded buffers. Instead, non-graded buffer approaches rely on specific structures and/or methods to reduce defect density. Often these structures and methods are also specific to a particular material system, and are not readily applicable to significantly different material systems.

For the SiGe material system, graded buffers have been investigated (e.g., U.S. Pat. No. 6,724,008, U.S. Pat. No. 6,864,115). Non-graded buffers in the SiGe system have also been investigated (e.g., the three layer buffer of U.S. Pat. No. 6,987,310). Since this three layer buffer structure is relatively complicated, it would be an advance in the art to provide simpler lattice mismatched SiGe growth.

SUMMARY

Growth of SiGe on a significantly lattice mismatched substrate (e.g., Si) is provided by depositing a SiGe buffer layer at a growth temperature, then annealing the resulting structure at a temperature higher than the growth temperature. Additional buffer layers can be included following the same steps. The SiGe buffer is significantly lattice mismatched with respect to the substrate, and is preferably substantially lattice matched with a SiGe device to be grown on top of the buffer. The resulting buffer structure is relatively thin and provides low defect density, and low surface roughness. Disadvantages of thick graded buffer layers, such as high cost, large surface roughness, mechanical fragility, and CTE mismatch, are thereby avoided.

DETAILED DESCRIPTION

Figure 1:
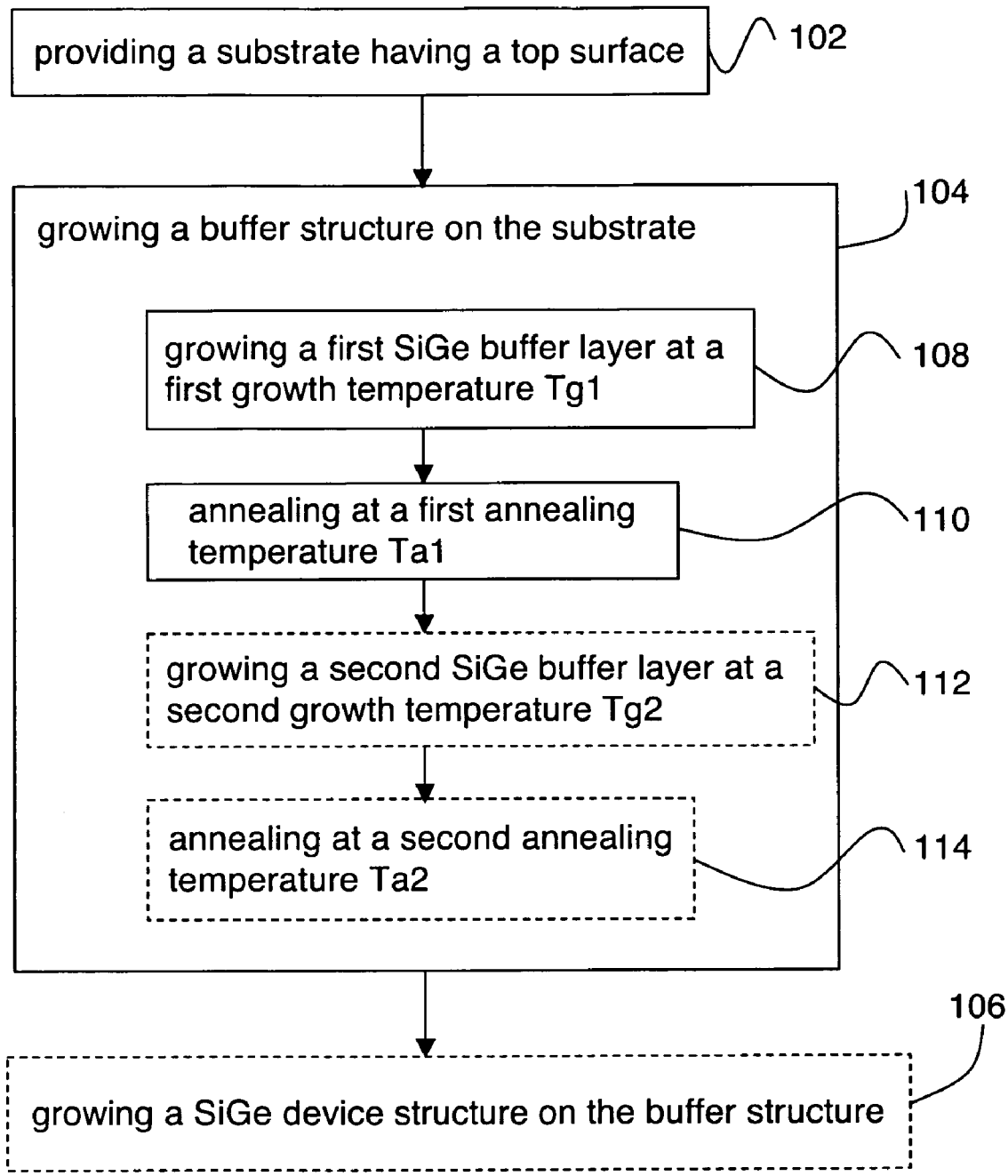
FIG. 1 shows a growth method according to an embodiment of the invention.

FIG. 1 shows a growth method according to an embodiment of the invention. Step 102 is providing a substrate, step 104 is growing a buffer structure on the substrate, and optional step 106 is growing a SiGe device structure on top of the buffer structure. More specifically, step 104 includes step 108 of growing a first $Si_{1-x}Ge_x$ buffer layer on the top surface of the substrate to provide a first intermediate structure. This growth is performed at a first growth temperature Tg1. Preferably, Tg1 is between about 300° C. and about 700° C. Step 104 also includes step 108 of first annealing the first intermediate structure at a first annealing temperature Ta1. Preferably, Ta1 is between about 550° C. and about 1000° C., and annealing is performed for a time between about 1 minute and about 60 minutes. A more preferable first annealing time range is between about 20 minutes and about 60 minutes. The first annealing temperature Ta1 is substantially greater than the first growth temperature Tg1.

A second buffer layer can be included in the buffer structure according to optional steps 112 and 114. More specifically, step 104 can include optional step 112 of growing a second $Si_{1-y}Ge_y$ buffer layer on the first buffer layer to provide a second intermediate structure. This growth is performed at a second growth temperature Tg2. Preferably, Tg2 is between about 300° C. and about 700° C. Step 104 can also include optional step 114 of second annealing the second intermediate structure at a second annealing temperature Ta2. Preferably, Ta2 is between about 550° C. and about 1000° C., and annealing is performed for a time between about 1 minute and about 60 minutes. A more preferable second annealing time range is between about 5 minutes and about 20 minutes. The second annealing temperature Ta2 is substantially greater than the second growth temperature Tg2. Additional buffer layers can be deposited following the same steps, although having only one or two buffer layers is preferred. Suitable growth techniques for step 108 and optional step 112 include, but are not limited to, chemical vapor deposition (CVD) and molecular beam epitaxy (MBE).

Preferably, the total thickness of the buffer structure is between about 0.1 μm and about 0.5 μm. The disadvantages of thick buffer structures (e.g., cost, mechanical fragility, surface non-uniformity, and CTE mismatch) are thereby alleviated. The approach of the present invention is not a graded buffer approach. Instead, the buffer structure preferably has a composition selected to provide a lattice match to the SiGe device structure that will eventually be grown on top of the buffer structure. The combination of substrate and buffer structure can be regarded as a "device substrate", in the sense that growth of SiGe devices lattice matched to the top surface of the buffer structure is facilitated. In cases where the buffer structure includes two or more buffer layers, it is preferred for all buffer layers to have the same composition.

In some cases, the buffer structure is lattice matched to a strain-averaged lattice constant of the SiGe device structure. For example, if the SiGe device structure includes a multiple quantum well region where the wells and barriers have different lattice constants, matching the buffer to the strain-averaged lattice constant of the device structure is preferred. In other cases, strain averaging is not necessary (e.g., a single quantum well with sufficiently thick barriers), and the buffer can be lattice matched to the SiGe device structure (i.e., the barrier lattice constant in the single quantum well example).

Since the buffer structure is lattice matched to the device structure, and the device structure is significantly lattice mismatched with respect to the substrate, the buffer structure is also significantly lattice mismatched with respect to the substrate. In particular, the first SiGe buffer layer has a significant lattice mismatch to the substrate on which it is deposited (typically >1.5%, and often 3% or more), in sharp contrast to conventional graded buffer approaches such as the discrete grading approach of U.S. Pat. No. 6,864,115, where an interface mismatch of less than 1% is employed.

A key discovery of the present invention is that defect density can be reduced to levels sufficient for fabricating devices, despite the large lattice mismatch at the interface between the substrate and the first buffer layer. In particular, the threading dislocation density at the top surface of the buffer structure is typically between about $10^7 \, cm^{-2}$ and about $10^8 \, cm^{-2}$. Furthermore, the top surface of the buffer structure typically has a root mean square roughness of less than about 1 nm, which advantageously eliminates the need for a separate planarization step in further processing. Although the above dislocation densities are higher than preferred for devices which are especially sensitive to defects (e.g., semiconductor lasers), these dislocation densities are not an issue for many devices which are less sensitive to dislocation density, such as optical modulators and detectors.

Another significant discovery of the invention is that the Si in the SiGe buffer layers usefully tends to decrease surface roughness. More specifically, the above methods entail growing the first buffer layer at a single growth temperature. Such single temperature buffer layer growth has been found to provide good results for SiGe growth, provided the Si concentration is greater than about 5%. However, for Ge buffer layers, it is known that growth at two or more temperatures (or a separate planarization step) is needed to reduce surface roughness to tolerable levels.

Since the buffer structure includes SiGe having comparable composition to the SiGe in the device structure (since there is a lattice match between the two), it is preferred for the device structure growth temperature and the buffer structure growth temperature to be substantially equal. In cases where the buffer structure includes two or more layers, it is preferred that all of these buffer layers also be grown at the same temperature. Having equal growth temperatures for buffer and device significantly simplifies growth rate calibration, since growth rate tends to depend significantly on growth temperature. In addition, the growth temperatures can be low enough to provide compatibility with standard CMOS processing (i.e., growth temperatures less than about 400° C.).

In some cases, step 104 of growing a buffer structure and step 106 of growing a SiGe device structure are performed sequentially in the same growth chamber without removing the structure from the growth chamber prior to completion of the device structure. This capability of single-run growth is enabled by the low surface roughness of the as-grown buffer, which eliminates the need for a separate planarization step (which typically would be performed outside the growth chamber). In other cases, it can be advantageous to perform separate steps at separate processing stations. In particular, it can be advantageous to anneal two or more wafers simultaneously, each wafer being processed according to step 104, thereby reducing annealing time per wafer.

Figure 2:
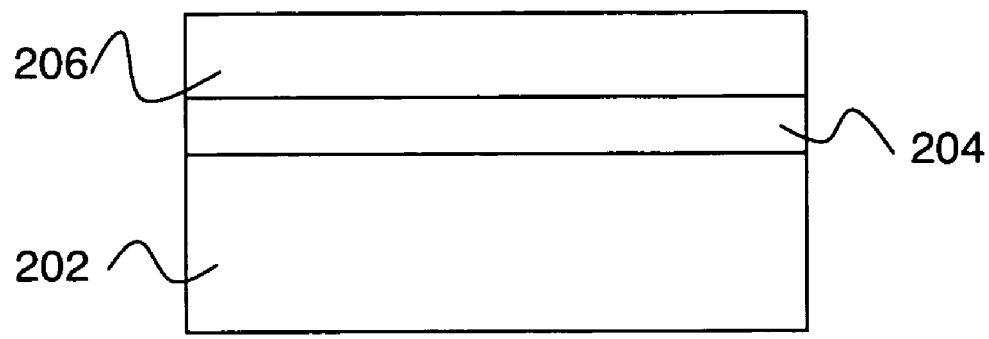
FIG. 2 shows a device substrate according to an embodiment of the invention.

FIG. 2 shows a device substrate according to an embodiment of the invention. The device substrate of the example of FIG. 2 includes a substrate 202, a first buffer layer 204 and a second buffer layer 206. First and second buffer layers 204 and 206 are deposited according to step 104 of FIG. 1. Substrate 202 is preferably <001> oriented Si, but any substrate suitable for growth of mismatched SiGe can be employed, such as substrates suitable for silicon on insulator (SOI) or SiGe on insulator (SGOI) growth.

Figure 3:
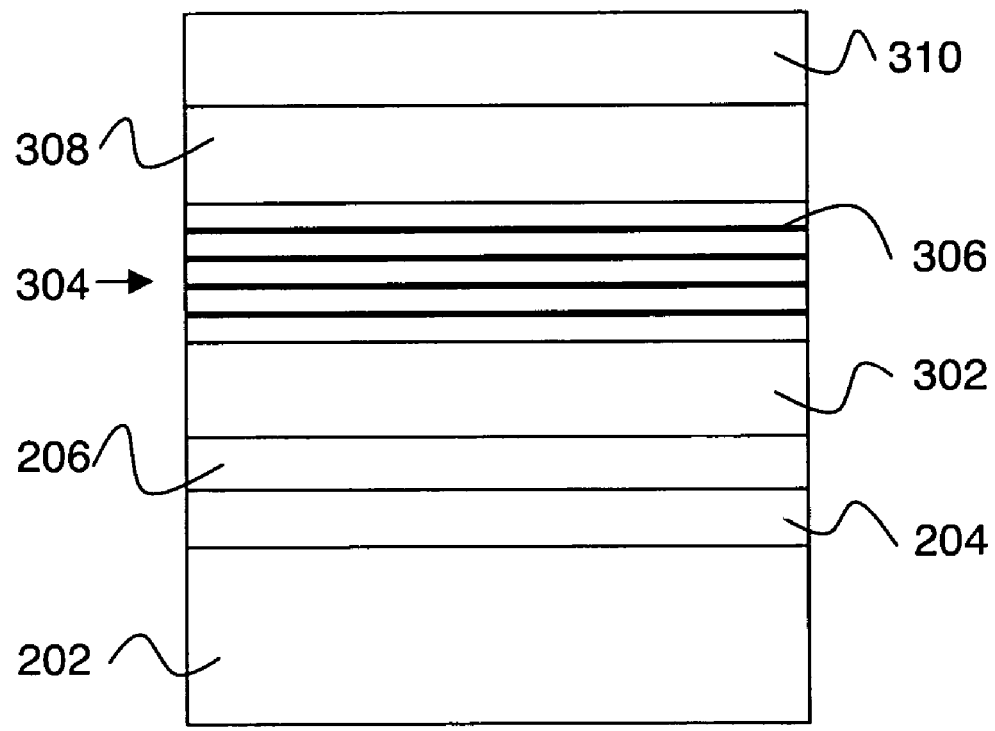
FIG. 3 shows a quantum well device according to an embodiment of the invention.

FIG. 3 shows a quantum well device according to an embodiment of the invention. Substrate 202, first buffer layer 204 and second buffer layer 206 together make up a device substrate as described in connection with FIG. 2. In this example, the SiGe device structure is a PIN diode including an undoped multiple quantum well (MQW) region 304 including quantum wells 306. More specifically, buffer layers 204 and 206 are p-doped, cap layer 310 is n-doped SiGe, and spacer layers 302 and 308 are undoped SiGe. The purpose of spacer layers 302 and 308 is to prevent dopant diffusion into MQW region 304. This is a preferred device geometry for applying a variable electric field to the quantum wells, since varying a reverse bias on the diode changes the electric field at the quantum wells. In this example, p-doping and n-doping can be exchanged. In general, the buffer layers can be doped or undoped, and the device structure grown on the device substrate can have any structure or doping.

In a preferred embodiment of the invention, MQW region 304 includes one or more quantum wells having a $Si_{1-z}Ge_z$ well layer with z greater than about 0.7. Such quantum wells are suitable for optoelectronic applications, such as modulators and detectors, even though their bandgap is indirect, because such well materials have a conduction band minimum at the Brillouin zone center. This Kane-like band structure at zone center provides optoelectronic physical effects characteristic of direct-gap materials (e.g., quantum confined stark effect as in GaAs/AlGaAs) in indirect band gap materials. For z less than about 0.7, the band structure is not Kane-like at zone center, and the optoelectronic physical effects characteristic of direct gap materials are eliminated or greatly reduced. Further description of indirect-gap SiGe having Kane-like band structure is given in U.S. patent application Ser. No. 11/230,285.

Figure 4:
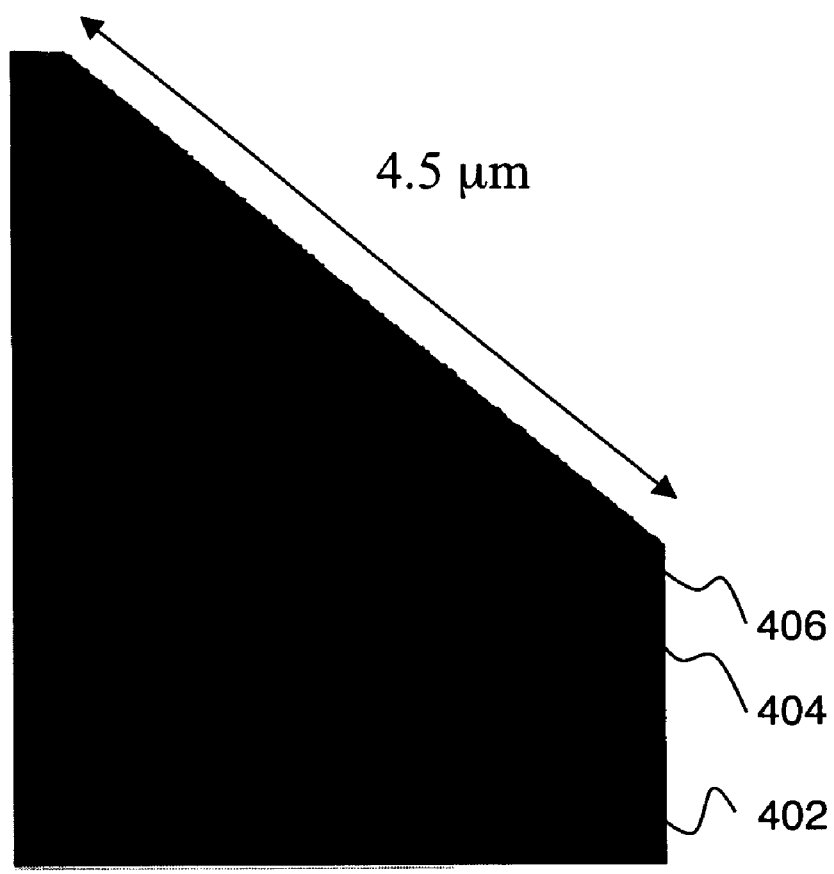
FIG. 4 is a transmission electron microscope (TEM) photograph of annealed Si—Ge buffer layers according to an embodiment of the invention.

FIG. 4 is a transmission electron microscope (TEM) photograph of annealed SiGe buffer layers grown on silicon according to an embodiment of the invention. Substrate 402 and buffer layers 404 and 406 on FIG. 4 correspond to substrate 202 and buffer layers 204 and 206 on FIG. 2. Buffer layers 404 and 406 are 300 nm thick layers of $Si_{0.05}Ge_{0.95}$. No threading dislocations are seen in the top buffer layer 406 in this TEM image.

Figure 5:
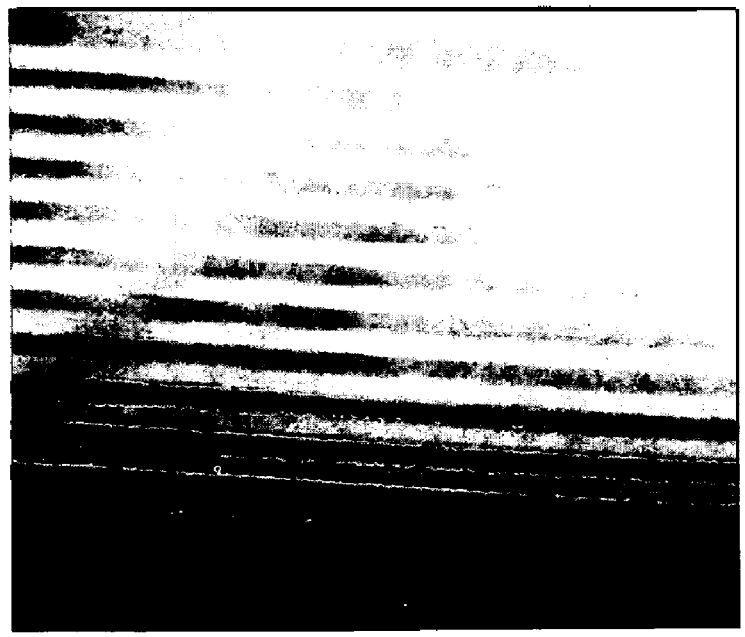
FIG. 5 is a TEM photograph of Si—Ge quantum wells according to an embodiment of the invention.

FIG. 5 is a TEM photograph of SiGe quantum wells grown on a device substrate similar to that of FIG. 4, except that the buffer Ge concentration here is 90%, according to an embodiment of the invention. In the example of FIG. 5, the quantum well composition is pure Ge, and the barrier composition is $Si_{0.15}Ge_{0.85}$. The well and barrier thicknesses are 10 nm and 16 nm respectively. The result of FIG. 5 demonstrates growth of a high-quality SiGe heterostructure on a silicon substrate. This example also demonstrates lattice matching of the buffer to a strain-averaged lattice constant of the device structure. Here strain averaging of 10 nm Ge wells and 16 nm 85% Ge barriers gives a strain averaged lattice constant that matches the lattice constant of the 90% Ge buffer.

Figure 6:
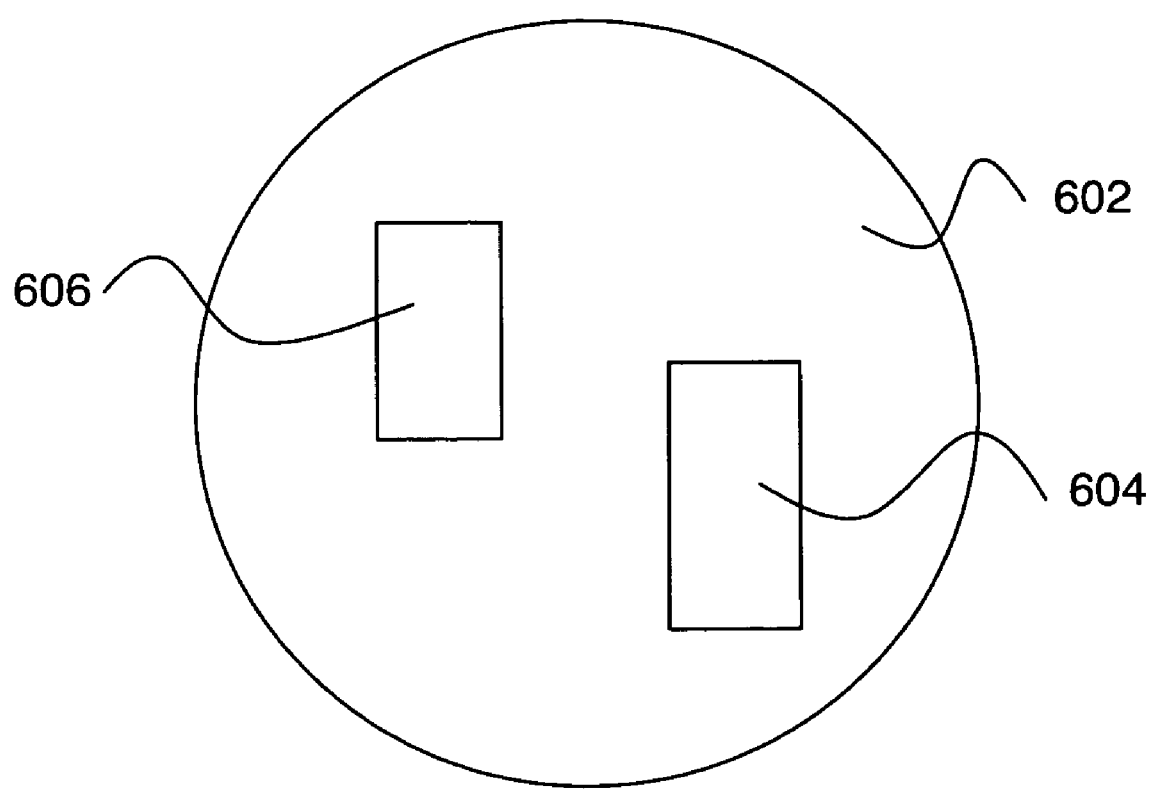
FIG. 6 shows a substrate for area-selective epitaxy according to an embodiment of the invention.

FIG. 6 shows a substrate for area-selective epitaxy according to an embodiment of the invention. In the example of FIG. 6, a substrate 602 has a top surface which is partially crystalline and partially non-crystalline. More specifically in this example, regions 604 and 606 are crystalline, while the remaining surface is non-crystalline. Such a substrate can be formed by depositing a non-crystalline material (e.g., an oxide) on a crystalline substrate (e.g., Si), and then patterning the non-crystalline layer to open up regions such as 604 and 606. Deposition of buffer layers according to the invention can then selectively take place only in the crystalline regions.

The invention claimed is:

1. A method for growth in the SiGe material system, the method comprising:
   a) providing a substrate having a top surface;
   b) growing a buffer structure on the substrate, wherein the growing a buffer structure comprises:
      i) first growing a first buffer layer comprising $Si_{1-x}Ge_x$ on the top surface of the substrate at a first growth temperature to provide a first intermediate structure;
      ii) first annealing the first intermediate structure at a first annealing temperature, wherein the first annealing temperature is substantially greater than the first growth temperature;
   c) growing a SiGe device structure on said buffer structure, wherein a top surface of the buffer structure is substantially lattice matched to the SiGe device structure;
   wherein said top surface of said substrate has a substrate lattice constant, wherein said first buffer layer has a buffer lattice constant, and wherein the buffer lattice constant and the substrate lattice constant differ by more than 1.5%;
   wherein said buffer structure has a substantially uniform Ge concentration;
   wherein said SiGe device structure includes a quantum well having a SiGe well layer sandwiched between SiGe barrier layers, wherein the well layer comprises $Si_{1-z}Ge_z$, wherein z is greater than about 0.7, whereby the well layer has an indirect band gap and has a conduction band minimum at a center of its Brillouin zone.

2. The method of claim 1, wherein said top surface of said substrate comprises a single-crystal silicon surface.

3. The method of claim 1, wherein said top surface of said substrate comprises a non-crystalline surface.

4. The method of claim 1, wherein said top surface of said substrate is partially crystalline and partially non-crystalline.

5. The method of claim 1, wherein said substrate comprises silicon.

6. The method of claim 1, wherein a top surface of said buffer structure has a root mean square roughness of less than about 1 nm.

7. The method of claim 1, wherein said first annealing is performed for a time between about 1 minute and about 60 minutes.

8. The method of claim 1, wherein said first growth temperature is between about 300° C. and about 700° C.

9. The method of claim 1, wherein said first annealing temperature is between about 550° C. and about 1000° C.

10. The method of claim 1, wherein a total thickness of said buffer structure is between about 0.1 μm and about 0.5 μm.

11. The method of claim 1, wherein a threading dislocation density at said top surface of said buffer structure is between about $10^7$ cm$^{-2}$ and about $10^8$ cm$^{-2}$.

12. The method of claim 1, wherein said first annealing is performed simultaneously on two or more of said first intermediate structures, each of the two or more first intermediate structures being disposed on a separate semiconductor wafer, whereby annealing time per wafer is reduced.

13. The method of claim 1, wherein said growing a buffer structure further comprises:
   iii) second growing a second buffer layer comprising $Si_{1-y}Ge_y$ on the first buffer layer at a second growth temperature to provide a second intermediate structure;
   iv) second annealing the second intermediate structure at a second annealing temperature, wherein the second annealing temperature is substantially greater than the second growth temperature.

14. The method of claim 13, further comprising growing a SiGe device structure on top of said buffer structure at a device growth temperature substantially equal to said first growth temperature and substantially equal to said second growth temperature.

15. The method of claim 13, wherein x and y are substantially equal.

16. The method of claim 13, further comprising growing a SiGe device structure on said second buffer layer.

17. The method of claim 1, wherein said SiGe device structure is adjacent to said first buffer layer.

18. The method of claim 1, wherein said growing a SiGe device structure is performed at a device growth temperature substantially equal to said first growth temperature.

19. The method of claim 1, wherein said SiGe device structure has a strain-averaged lattice constant substantially equal to a lattice constant of said first buffer layer.

20. The method of claim 1, wherein said SiGe device structure has a lattice constant substantially equal to a lattice constant of said first buffer layer.

21. The method of claim 1, wherein a lattice mismatch between said SiGe device structure and said top surface of said substrate is greater than about 3%.

22. The method of claim 1, wherein said growing a buffer structure and said growing a SiGe device structure are performed sequentially in the same growth chamber, and are performed without removing said substrate from the growth chamber prior to completion of said SiGe device structure.

23. Apparatus comprising a SiGe structure fabricated according to the method of claim 1.

* * * * *